United States Patent [19]

Fry, Jr.

[11] 4,114,092
[45] Sep. 12, 1978

[54] POWER CIRCUIT IDENTIFIER WHICH PRODUCES A VOLTAGE PULSE IN RESPONSE TO INTERRUPTION OF POWER

[76] Inventor: James H. Fry, Jr., P.O. Box 230, Columbia, Pa. 17512

[21] Appl. No.: 818,923

[22] Filed: Jul. 25, 1977

[51] Int. Cl.² .............................................. G01R 19/16
[52] U.S. Cl. ...................................................... 324/66
[58] Field of Search ................... 324/51, 52, 66, 67; 179/175.3 A

[56] References Cited

U.S. PATENT DOCUMENTS

| 2,789,268 | 4/1957 | Bechtel et al. | 324/66 |
| 3,076,931 | 2/1963 | Jasper | 324/66 |
| 3,281,677 | 10/1966 | Baggott | 324/51 X |
| 3,745,453 | 7/1973 | Wright | 324/51 |
| 3,810,003 | 5/1974 | Portoulas | 324/51 |
| 3,924,179 | 12/1975 | Dozier | 324/67 X |
| 3,982,181 | 9/1976 | Ferony et al. | 324/67 X |

Primary Examiner—Gerard R. Strecker
Attorney, Agent, or Firm—Martin Fruitman

[57] ABSTRACT

An apparatus for tracing electrical power circuits by only one individual worker. A signal generator, which, when its source of power is interrupted, furnishes a signal to the electrical power line from which it derives that power and permits an electrician to test the lines at the main power distribution point. The line which indicates a signal shortly after being disconnected at the fuse box is the circuit being sought. The delayed signal is accomplished either by semiconductors or by delayed action relays.

11 Claims, 3 Drawing Figures

POWER CIRCUIT IDENTIFIER WHICH PRODUCES A VOLTAGE PULSE IN RESPONSE TO INTERRUPTION OF POWER

BACKGROUND OF THE INVENTION

This invention relates generally to electrical testing devices and more specifically to conductor identification devices.

Identifying one circuit out of a multiple group is a difficult and time consuming task even when both ends of the entire group are located on a work bench in front of you, but the task is severely aggravated when the circuits are enclosed in the walls of a building and the terminals spread out among the floors and rooms of that building. The choice of approaches in such a case has been limited to using several workers and shouting back and forth between them, or for one worker to move back and forth between terminals as he works by trial and error. Anyone who has ever attempted to find the fuse by which to disconnect an outlet in his home knows the usual process. First, one turns on a light connected to that outlet. Then you run to the main distribution box, usually down one or two flights of stairs, and taking your best guess as to which circuit the outlet is on, remove that fuse. Then you go back to the lamp and verify whether it is on or off. If it is off, the guess was correct; if not, one has to try again. Multiplying this procedure by the number of electrical outlets in a building makes the tracing of power circuits a tedious and costly procedure. The prior art of circuit tracing deals essentially with tracing for signal, telephone and computer circuits, using complex and sophisticated devices in which all terminals are connected to one device which identifies the various lines. The typical electrician can not carry such equipment with him, and, even if he could, it is impossible to connect such a device to all the building outlets at one time.

The present invention gives to the typical building trades electrician an inexpensive portable device by which he can trace the circuits within a building with a minimum of labor.

SUMMARY OF THE INVENTION

The present invention permits the user to plug the power circuit identifier into an outlet whose circuit is to be identified, and, with one trip to the main distribution panel, identify the fuse or circuit breaker which supplies that outlet. The user need only disconnect the fuse or circuit breaker and then put a voltmeter on the disconnected line. When he has performed that operation on the circuit to which the invention is connected, the meter will indicate a short decaying pulse.

This action is accomplished by a simple circuit, which, upon loss of power and after a short delay to give time to connect a meter to the power line, discharges a previously charged capacitor onto the unit's power lines. This expotentially decaying pulse feeds back to the building circuit and to the line upon which the operator has placed a meter. The pulse has sufficient energy to activate a typical multimeter, and, in fact, will vary in decay time sufficiently with loading of the circuit to give the operator a reasonable indication of the other load remaining on that power line. The operator is, therefore, able to not only identify the power line being sought, but also evaluate the number or type of loads connected to other portions of that power line, and whether devices are properly connected.

The circuit that performs the action consists of a D.C. power supply, a capacitor, a switching circuit which switches the capacitor across the input power line whenever power is interrupted, and a timing circuit to delay the switching circuit sufficiently to furnish time to put the meter on the circuit. The energy in the capacitor is thereby discharged across the power line and whatever other load is connected to that line. The preferred embodiment uses relays to accomplish this switching action, but the same result can be accomplished by an alternate embodiment using semiconductor devices.

DETAILED DESCRIPTION OF THE INVENTION

Figure 1:
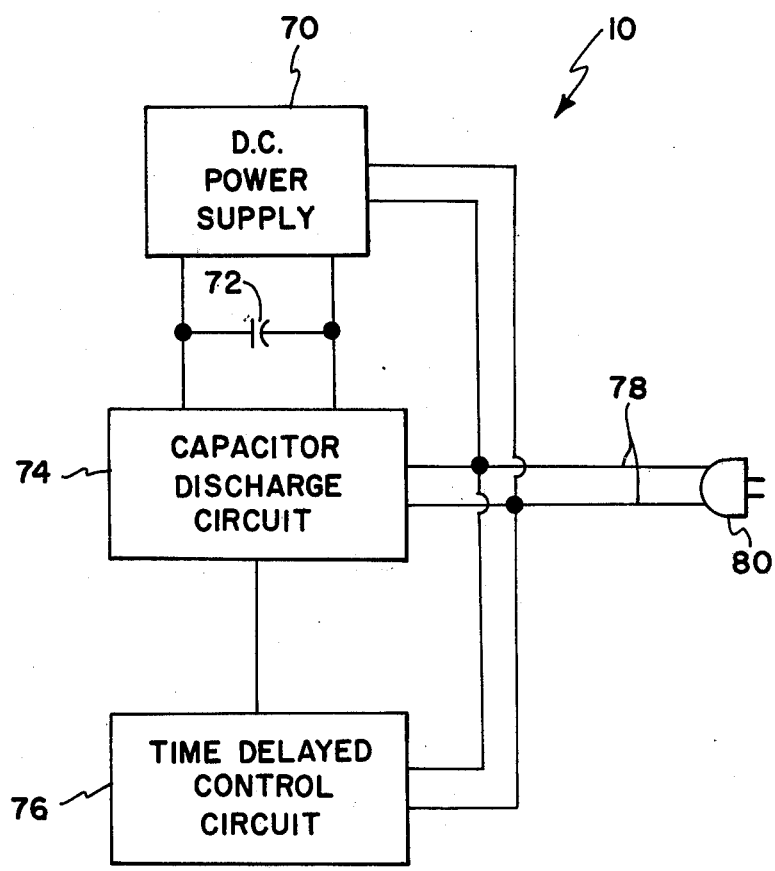
FIG. 1 is a simplified block diagram of the circuit of the invention.

The basic circuit of the invention is illustrated in block diagram form in FIG. 1, where it is shown that the invention contains four basic functional circuits, power supply 70, capacitor 72, capacitor discharge circuit 74, and time delayed control circuit 76. In FIG. 1, power input lines 78 are connected to plug 80 which connects power circuit identifier 10, to the building power lines. D.C. power supply 70 converts power from the building A.C. circuits to direct current to charge capacitor 72. Capacitor discharge circuit 74 and time delayed control circuit 76 are also connected to power input lines 78. Time delayed control circuit 76 is connected to the building power to be able to sense the time at which power is interrupted and its timing cycle is required to begin. This, in effect, permits the operator to remotely control power circuit identifier 10 by interrupting power while at a remote central distribution point.

Capacitor discharge circuit 74 is connected to input power lines 78 in order to discharge capacitor 72 back into the building power line when the time delay of time delay control circuit 76 has elapsed.

Figure 2:
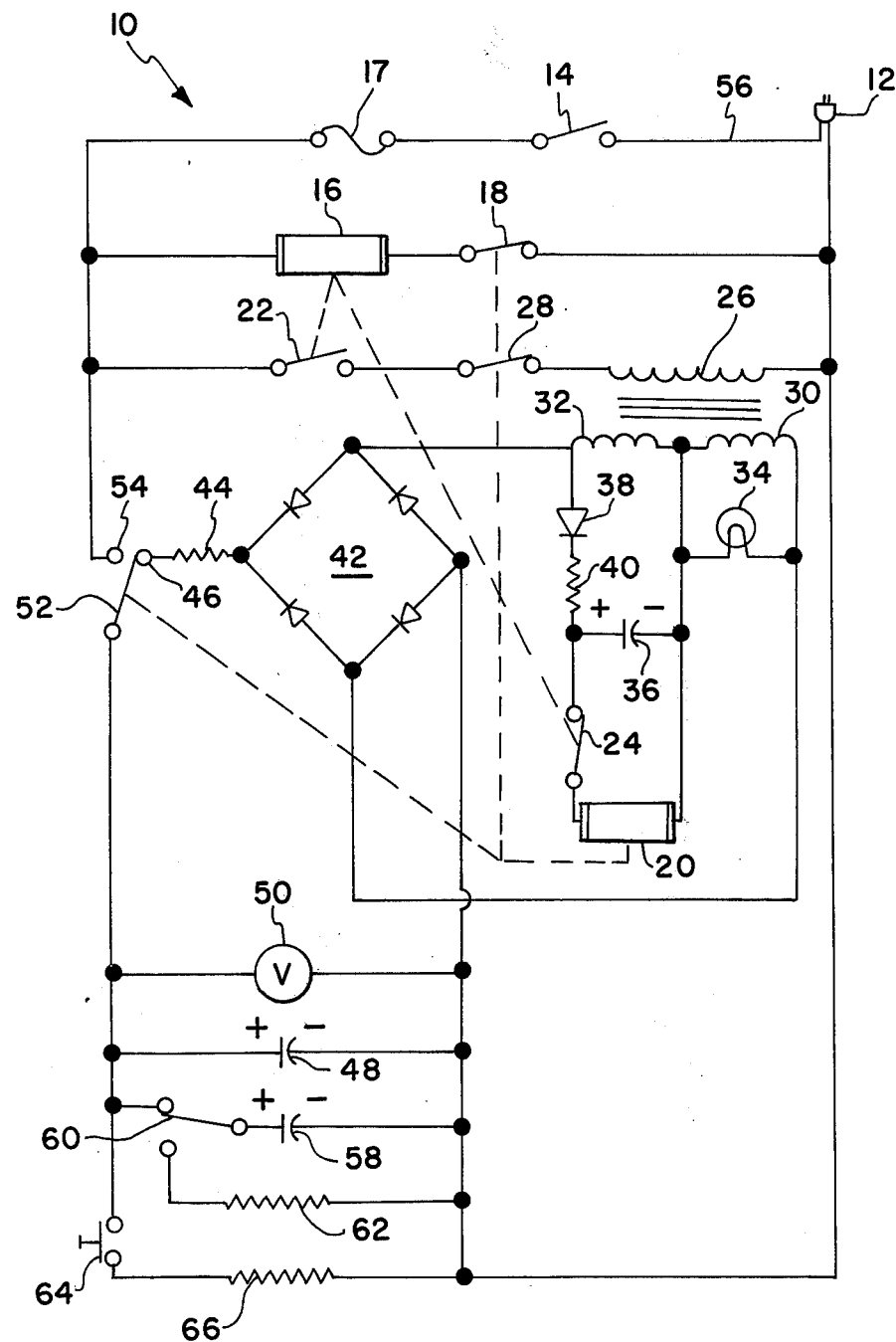
FIG. 2 is a schematic diagram of the preferred embodiment of the invention using relays.

The preferred embodiment of the invention is shown in schematic form in FIG. 2, where power circuit identifier 10 is constructed essentially from relays. It is connected to any conventional electrical outlet by means of plug 12. When plug 12 is inserted into an outlet and switch 14 is turned on, electrical power is applied to relay coil 16 through fuse 17 and normally closed contacts 18 of relay coil 20. Upon activation of relay coil 16, associated contacts 22 close and contacts 24 open. With contacts 22 closed, power is applied to transformer primary winding 26 through normally closed contacts 28 of relay coil 20. Transformer secondary windings 30 and 32 are thus powered and lamp 34 is lit indicating that power is applied to the circuit. Capacitor 36 is then charged through diode 38 and resistor 40, but relay contact 24 of relay coil 16 being open prevents relay coil 20 from having power applied.

Secondary winding 30 and 32 also apply power to bridge rectifier 42, which, through resistor 44 and normally closed contact 46 of relay coil 20, charges capacitor 48 and activates voltmeter 50 indicating the unit is completely operative.

Once the operator plugs the unit into an outlet and verifies the reading on meter 50, he proceeds to the main distribution panel of the building and begins disconnecting each building circuit in sequence. After each circuit is disconnected by either pulling the fuse or throwing the circuit breaker, a conventional multimeter set for the D.C. Volts scale is connected between the disconnected circuit and the common circuit return. When the circuit disconnected is the one to which the power circuit tracer has been connected, the meter will indicate a pulse of voltage a short time after disconnecting power. If there is any doubt, the circuit need only be reconnected and then disconnected again.

The power circuit identifier embodiment of FIG. 2 creates the pulse in the following manner. Capacitor 48 having been charged, when power fails, relay coil 16 loses its source of power. Relay 16, a conventional time-delay-to-deactivate relay, does not, however, immediately change its contacts 22 and 24 back to their original status. By electronic, mechanical or pneumatic means, a time delay occurs before the contacts change upon power loss. This time delay is preset for a time sufficient to permit the operator to disconnect power and then connect the multimeter to the disconnected circuit.

When the contact 22 and 24 do finally revert to their original condition, contact 24 closes and applies the voltage of capacitor 36 to relay coil 20, activating contacts 18 and 28 and contact arm 52 associated with relay coil 20. Contact arm 52 closes contact 54 applying the voltage on capacitor 48 to incoming power line 56. Meanwhile, contacts 18 and 28 open, breaking the circuits of relay coil 16 and transformer primary 26 to prevent loading the discharge of capacitor 48.

The time that the discharge pulse persists on the operator's multimeter is of some value in judging the load on the circuit being tested. A very short time of persistence indicates a relatively heavy load on the circuit, while a slow decay of voltage indicates the circuit is unloaded or relatively lightly loaded. To aid in this judgment and particularly to counteract the effects of a heavily loaded circuit, capacitor 58 may be added to increase the stored energy in the circuit by changing switch 60 from its position to discharge capacitor 58 through resistor 62 to its position to parallel capacitor 58 with capacitor 48. Pushbutton switch 64 is furnished to discharge the energy stored in the capacitors through resistor 66 if the power circuit tracer is disconnected by the operator when power is being applied. Such action will prevent accidental shock by the stored energy of the capacitors.

Figure 3:
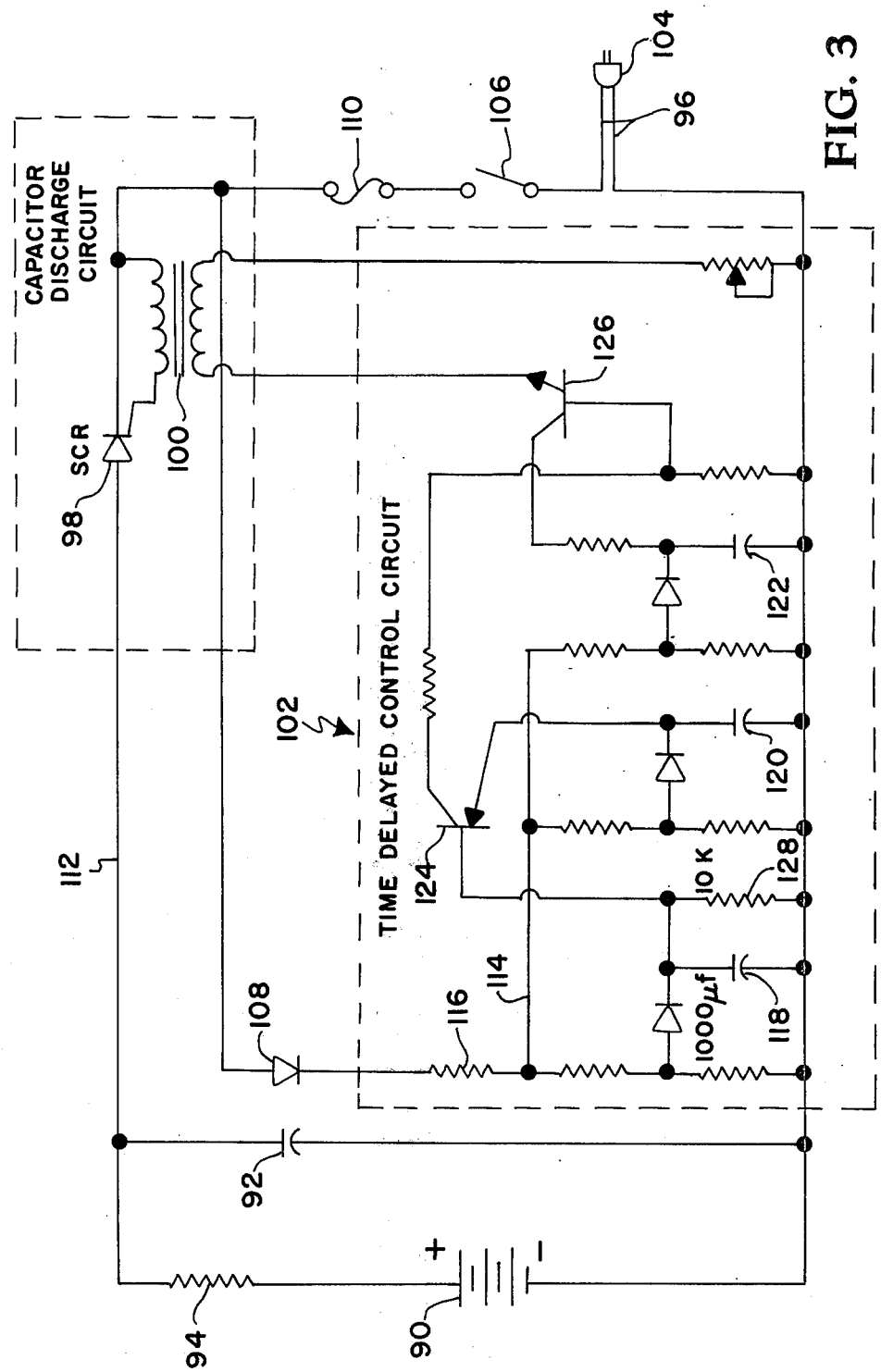
FIG. 3 is a schematic diagram of an alternate embodiment of the invention using semiconductor devices.

An alternate embodiment of the invention using semiconductors for switching and time delay circuitry is shown in FIG. 3 without the safety discharge and pilot light features. The circuit can derive its power from either the power line similar to the means shown in FIG. 2 for the relay circuit or from an independent source of power such as battery 90 as shown in FIG. 3. Battery 90 charges capacitor 92 through resistor 94 and capacitor 92 is discharged across power lines 96 when Silicon Controlled Rectifier (SCR) 98 is triggered through pulse transformer 100 by time delayed control circuit 102.

As in the relay embodiment, the semiconductor power circuit identifier is connected to building electrical lines by inserting convention power plug 104 into a wall receptacle (not shown) and closing power switch 106. Power is then applied to diode 108 through fuse 110, while SCR 98 blocks conduction to line 112 which is connected to capacitor 92.

Time delayed control circuit 102 is essentially a conventional transistor circuit, one of several well known in the art, for triggering a silicon controlled rectifier, but it differs in its means of initiation of signal, since the invention requires a time delay after loss of power on lines 96. D.C. power buss 114 is supplied power from power lines 96 via diode 108 and resistor 116. Capacitors 118, 120 and 122, supplying energy to transistors 124 and 126, are thus charged directly from the power line. Capacitors 120 and 122 are of sufficient capacitance and lightly enough loaded to remain charged after the power on lines 96 is interrupted. Capacitor 118 is, however, loaded by resistor 128 and together they determine a resistance-capacitance time delay during which capacitor 118 is discharged after removal of power from buss 114. This time delay determines the lapse of time before which transistor 124 conducts, in turn causing transistor 126 to trigger SCR 98 via pulse transformer 100. SCR 98 thus discharges capacitor 92 across power lines 96 producing an expotential decaying pulse on all the building circuits to which plug 104 has been connected. The utilization of this pulse for identifying the power line is the same as that described for the relay embodiment.

It is to be understood that the forms of this invention as shown are merely preferred embodiments. Various changes may be made in the function and arrangement of parts; equivalent means may be substituted for those illustrated and described; and certain features may be used independently from others without departing from the spirit and scope of the invention as defined in the following claims.

What is claimed as new and desired to be secured by Letters Patent of the United States is:

1. An apparatus for identifying which of several sources is the source of one power line out of a group, which comprises:
   a direct curent power supply means;
   a capacitor electrically connected to and charged by the power supply means; and
   a switching means electronically connected to one location on the power line being identified and a common circuit return, and activated by the interruption of power on the power line, also connected to the capacitor and switching the capacitor across the power line and the common circuit return upon interruption of power on the power line whereby interruption of power at the source of the power line, remote from the location of connection of the identifying apparatus, produces a voltage pulse from the capacitor, which when detected at the source, verifies that the power line which has been interrupted is the one to which the apparatus is attached.

2. An apparatus for identifying the source of one power line out of a group as in claim 1 further including a time delay means connected to the switching means to activate the switching means only when a prescribed time has elapsed after a power interruption on the power line being identified.

3. An apparatus for identifying the source of one power line out of a group as in claim 1 further including a first switching device to discharge the capacitor when the apparatus is disconnected from the power line when not in use.

4. An apparatus for identifying the source of one power line out of a group as in claim 1 further including a second switching device to optionally add at least one more capacitor in parallel with that capacitor charged by the power supply means.

5. An apparatus for identifying the source of one power line out of a group as in claim 1 further including means to automatically disconnect from the power line all components in the apparatus which may load the capacitor for that period of time while the capacitor is connected across the power line.

6. An apparatus for identifying the source of one power line out of a group as in claim 1 wherein the switching means is a relay.

7. An apparatus for identifying the source of one power line out of a group as in claim 1 wherein the switching means is a semiconductor device.

8. An apparatus for identifying the source of one power line out of a group as in claim 2 wherein the time delay means is a time delay to deactivate relay.

9. An apparatus for identifying the source of one power line out of a group as in claim 2 wherein the time delay means is a circuit comprising semiconductor devices initiated by a resistance-capacitance discharge time delay.

10. An apparatus for identifying the source of one power line out of a group as in claim 1 wherein the direct current power supply means derives its power from the power line being identified.

11. A method of identifying the source of one power line out of a group which comprises:

attaching between a remote point on one of a group of power lines to be identified, and a common return an electronic device which, upon interruption of its power, switches a charged capacitor across the source from which it previously received power;

sequentially disconnecting from a common distribution point, while power is applied, each power line of the group;

monitoring between each power line of the group and a common return with a voltage sensing instrument immediately after it is disconnected from the common distribution point; and identifying the line to which the electronic device is attached by observing the disconnected line which when disconnected indicates a pulse of voltage relative to the common return.

* * * * *